United States Patent [19]
Nakanishi

[11] Patent Number: 6,103,557
[45] Date of Patent: Aug. 15, 2000

[54] SEMICONDUCTOR DEVICE OR THIN-FILM TRANSISTOR MANUFACTURING APPARATUS AND MANUFACTURING METHOD

[75] Inventor: Shiro Nakanishi, Ohgaki, Japan

[73] Assignee: Sanyo Electric Co., Ltd., Moriguchi, Japan

[21] Appl. No.: 09/169,833

[22] Filed: Oct. 12, 1998

[30] Foreign Application Priority Data

Oct. 14, 1997 [JP] Japan .................................. 9-280360

[51] Int. Cl.⁷ ...................... M01L 21/00; M01L 21/4763
[52] U.S. Cl. ........................ 438/158; 438/160; 438/626; 438/656
[58] Field of Search ...................... 438/158, 159, 438/160, 626, 656, 758, 770, 765

[56] References Cited

U.S. PATENT DOCUMENTS

| | | | |
|---|---|---|---|
| 5,243,202 | 9/1993 | Mori et al. .................................. | 257/59 |
| 5,352,291 | 10/1994 | Zhang et al. .............................. | 437/173 |
| 5,527,567 | 6/1996 | Desu et al. ................................ | 427/573 |
| 5,976,989 | 11/1999 | Ishiguro et al. .......................... | 438/758 |

*Primary Examiner*—Richard Elms
*Assistant Examiner*—Michael S. Lebentritt
*Attorney, Agent, or Firm*—Cantor Colburn LLP

[57] ABSTRACT

First through fourth film formation chambers PC1 to PC4 are disposed in the periphery of a transfer chamber TC. If, for example, the ratio of the time required to form gate insulating films to the time required to form the silicon film as a semiconductor film is 1:3, a silicon nitride film and silicon oxide film are formed in the first through third film formation films PC1 to PC3 to become gate insulating films, and an amorphous silicon layer is formed in the fourth film formation chamber PC4 to become an active region. This makes it possible to perform formation of the amorphous silicon layer, which requires film cleaning, in a film formation chamber different from the film formation chamber for other films, and to manufacture thin-film transistors at high productivity.

5 Claims, 4 Drawing Sheets

SEMICONDUCTOR DEVICE OR THIN-FILM TRANSISTOR MANUFACTURING APPARATUS AND MANUFACTURING METHOD

BACKGROUND OF THE INVENTION

1. Field of the Invention

The present invention relates to a semiconductor device such as a thin-film transistor manufacturing apparatus, and a thin-film transistor manufacturing method using the apparatus.

2. Description of the Prior Art

FIG. 1 is a cross-sectional view showing a structure of the thin-film transistor to be used as pixel display switching devices in active matrix display panels. A bottom-gate type is shown in this figure.

On a surface of an insulating transparent substrate 1 is positioned a gate electrode 2 of a refractory metal, such as tungsten or chromium. The gate electrode 2 has both sides in a tapered shape widening toward the transparent substrate 1. On the transparent substrate 1 on which the gate electrode 2 is positioned, a silicon oxide film 4 is formed through a silicon nitride film 3. The silicon nitride film 3 prevents impurities contained in the transparent substrate 1 from penetrating an active region (to be described later), and the silicon oxide film 4 functions as a gate insulating film. On the silicon oxide film 4 is formed a polycrystalline silicon film 5 so as to straddle the gate electrode 2. The polycrystalline silicon film 5 becomes the active region of the thin-film transistor.

On the polycrystalline silicon film 5 is positioned a stopper 6 of an insulating material, such as silicon oxide. A portion of the polycrystalline silicon film 5 covered by the stopper 6 becomes a channel region 5c, and other portions of the polycrystalline silicon film 5 become a source region 5s and a drain region 5d. On the polycrystalline silicon film 5, on which the stopper 5 is formed, is formed a silicon oxide film 7 and a silicon nitride film 8. The silicon oxide film 7 and silicon nitride film 8 serve as interlayer insulating films to protect the polycrystalline silicon film 5 that includes the source region 5s and drain region 5d.

Contact holes 9 are formed at predetermined locations in the silicon oxide film 7 and silicon nitride film 8 on the source region 5s and drain region 5d. A source electrode 10s and a drain electrode 10d, which connect to the source region 5s and drain region 5d, are positioned at the contact holes 9. On the silicon nitride film 8, on which the source electrode 10s and drain electrode 10d are positioned, an acrylic resin layer 11, which is transparent to visible light, is formed. The acrylic resin layer 11 planarizes the surface by filling in the unevenness caused by the gate electrode 2 and stopper 6.

A contact hole 12 is formed in the acrylic resin layer 11 on the source electrode 10s. A transparent electrode 13, such as of indium tin oxide (ITO), that connects to the source electrode 10s through the contact hole 12 is then positioned so as to extend on the acrylic resin layer 11. The transparent electrode 13 forms a pixel electrode in a liquid crystal display panel.

In the above-mentioned thin-film transistor, a plurality of which are arranged in a matrix on the transparent substrate 1 together with pixel electrodes, image data supplied to the drain electrode 10d is impressed onto the respective pixel electrode in response to a scanning control signal that is impressed on the gate electrode 2.

The polycrystalline silicon film 5 is formed with a sufficiently large crystal grain diameter so that it functions as the active region of the thin-film transistor. A known method for forming a large crystal grain diameter of the polycrystalline silicon film 5 is laser annealing using an excimer laser. In laser annealing, amorphous silicon is formed onto the silicon oxide film 4, which becomes a gate insulating film, and after the hydrogen contained in the amorphous silicon is first removed through a low temperature heat treatment, the silicon is irradiated with the excimer laser and is initially melted so that the silicon crystallizes. Since portions on the transparent substrate 1 reaching high temperatures are localized due to the use of this sort of laser annealing method, a glass substrate having a low melting point can be used for the transparent substrate 1.

Formation of the silicon oxide film and silicon nitride film comprising the gate insulating film and interlayer insulating film is also possible at a low temperature of 400° C. or less and employs a highly flexible plasma CVD method. Since the plasma CVD method also makes it possible for the formation of amorphous silicon films, the formation of the amorphous silicon film, which becomes the polycrystalline silicon film 5, is normally performed by the same apparatus in succession to the formation of the gate insulating film.

When impurities are added during film formation in the polycrystalline silicon film 5, which forms the active region of the thin-film transistor, the impurities prevent carrier movement in the channel region 5c and cause the operating characteristics to deteriorate. In the plasma CVD method, when the gate insulating film and the amorphous silicon film, which becomes the polycrystalline silicon film 5, are formed in succession within the same film formation chamber, it becomes easy to contaminate the amorphous silicon film with the residual reactant gas used in the formation of the gate insulating film. Usually, during the formation of the gate insulating film, the same film is formed on the inner wall of the film formation chamber. With this sort of film formed, when the plasma for forming the amorphous silicon film within the film formation chamber is excited, the impurities are discharged from the film formed on the inner wall of the film formation chamber. Since the impurities discharged within the film formation chamber are taken into the amorphous silicon film, it is difficult to prevent the contamination by impurities even though the reactant gas within the film formation chamber is completely discharged.

SUMMARY OF THE INVENTION

It is therefore an object of the present invention to make it difficult for impurities to contaminate the active layer during formation of the semiconductor device, such as the thin-film transistor, and to provide an apparatus and manufacturing method to enable the manufacture of the thin-film transistor at high efficiency.

The semiconductor device manufacturing apparatus of the present invention comprises a first film formation chamber for depositing in succession at least two types of insulating films onto a substrate, a second film formation chamber for depositing a semiconductor film onto the substrate, and a transfer chamber for connecting the first film formation chamber to the second film formation chamber and for transferring the substrate from the first film formation chamber to the second film formation chamber, or from the second film formation chamber to the first film formation chamber, where one of the first or second film formation chambers performs a film formation process in succession to a film formation process of the other chamber.

Furthermore, in another aspect of the present invention, the semiconductor device manufacturing apparatus comprises the first film formation chamber for forming a first material film on the substrate, and the second film formation chamber for forming, after the first material film, a second material film unlike the first material film, where a ratio of a number of the first film formation chambers to that of the second film formation chambers is proportional to a ratio of the time required for film formation in the first film formation chamber to the time required for film formation in the second film formation chamber so that the first film formation chambers and the second film formation chambers are disposed with their numbers in a predetermined ratio.

In another aspect of the present invention, in the above-mentioned semiconductor device manufacturing apparatus, the time required for film formation in the first film formation chambers is longer than the time required for film formation in the second film formation chambers, and in correspondence a plurality of the first film formation chambers having a number greater than that of the second film formation chambers and performing film formation at a predetermined time difference from each other.

According to the present invention, the gate insulating films, for example, can be formed in the first film formation chamber, and the semiconductor film, for example, which becomes the active region, can be formed in the second film formation chamber. Since the semiconductor film is formed in a dedicated film formation chamber, it becomes difficult for the residual reactant gas, which is used in the formation of other films, to contaminate the semiconductor film.

In another aspect of the present invention, the thin-film transistor manufacturing method comprises a first process for forming a gate electrode on one principal plane of the substrate, a second process for forming gate insulating films covering the gate electrode on the substrate, a third process for forming the semiconductor film of an island shape on the gate insulating films so as to straddle the gate insulating films, and a fourth process for forming interlayer insulating films on the semiconductor film, where the second process processes in parallel a plurality of the substrates in a plurality of first film formation chambers at a predetermined time difference shorter than the time required for film formation, and the third process processes the substrates in succession in a single second film formation chamber at a time shorter than the film formation time in the second film formation chamber.

According to the present invention, the gate insulating film is formed in the plurality of first film formation chambers, and the semiconductor film is formed in the single second film formation chamber. Since the semiconductor film is formed in the dedicated chamber, there is no contamination during film formation by the residual reactant gas used for forming the other films. Furthermore, since a plurality of first film formation chambers are disposed for the gate insulating film, for which film formation becomes long, utilization efficiency of each film formation chamber improves when the gate insulating film and semiconductor film are formed in succession.

According to the present invention having the above-mentioned features, since the silicon film is formed as the semiconductor film in the dedicated film formation chamber, only the silicon film adheres to the inner wall of the film formation chamber or electrodes, so that even in a case where silicon films are formed in succession, the impurities do not discharge from the film adhering to the inner wall or electrodes of the film formation chamber. Therefore, contamination by impurities that prevent the migration of carriers to the active region is inhibited for the case of the thin-film transistor, thus preventing the degradation of the operating characteristics of the thin-film transistor. Furthermore, while the silicon film, which becomes the active region, is formed in a film formation chamber different from that for the gate insulating films, a drop in productivity can be prevented with an increase in time required for film formation kept to a minimum.

DETAILED DESCRIPTION OF THE PREFERRED EMBODIMENTS

Figure 2:
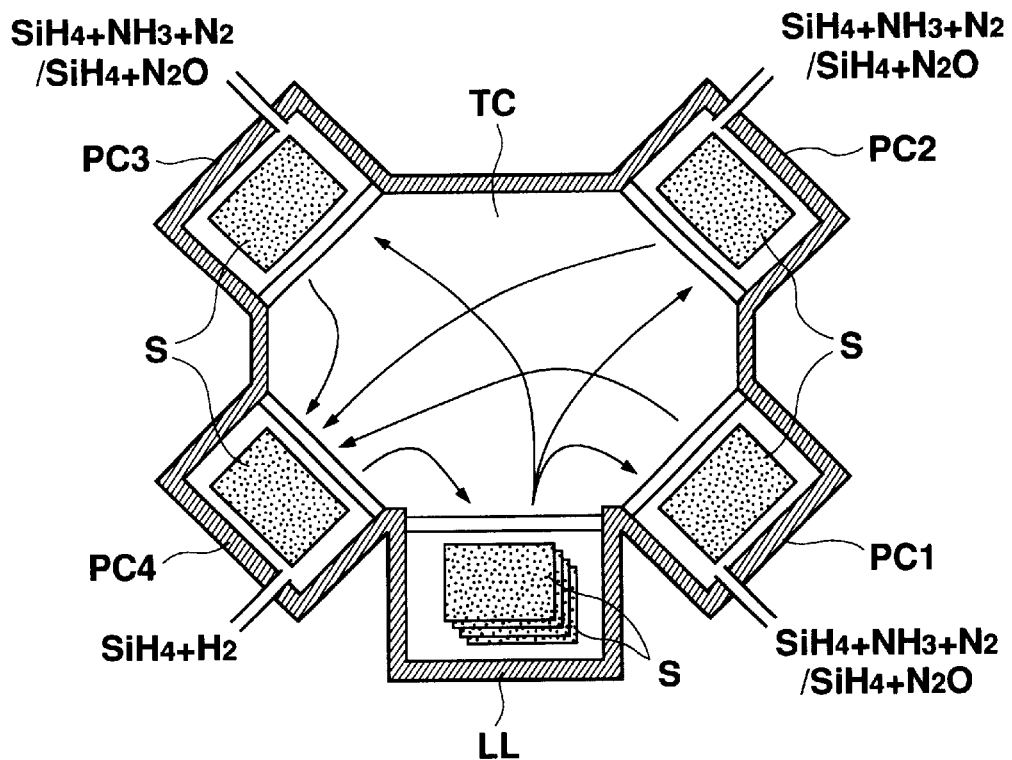
FIG. 2 is a schematic diagram showing a structure of a thin-film transistor manufacturing apparatus of the present invention.
Figure 3:
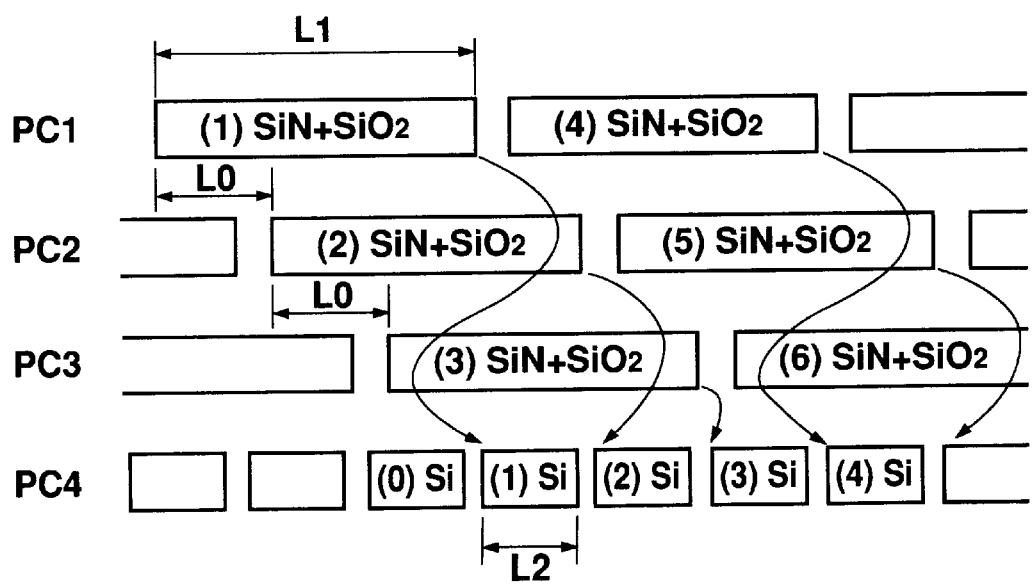
FIG. 3 is a timing diagram illustrating operations of the thin-film transistor manufacturing apparatus of the present invention.

FIG. 2 is a schematic diagram showing a structure of the thin-film transistor manufacturing apparatus of the present invention, and FIG. 3 is a timing diagram illustrating the timing of the film formation process. These drawings show a case having four film formation chambers.

A first to fourth film formation chambers PC1 to PC4 are disposed so as to surround a transfer chamber TC with each housing a substrate S. The first to third film formation chambers PC1 to PC3 successively form a silicon nitride film and a silicon oxide film onto the substrates S, and the fourth film chamber PC4 forms an amorphous silicon film. For example, at the first to third film formation chambers PC1 to PC3, the silicon nitride film is formed by receiving a supply of $SiH_4$, $NH_3$, and $N_2$, and the silicon oxide film is formed by receiving a supply of $SiH_4$ and $N_2O$. At the fourth film formation chamber PC4, the amorphous silicon film is formed by receiving a supply of silane and hydrogen.

A load lock LL is disposed in parallel with film formation chambers PC1 to PC4 in the periphery of the transfer chamber TC, and temporarily houses the substrate S to be loaded into the transfer chamber TC or the substrate S to be taken out after the film formation process. After a predetermined number (for example 12 substrates per lot) of substrates S are loaded from outside the apparatus in the loading operation, the load lock LL vents the outside air that was loaded with the substrates S and replaces it with an inert gas, such as nitrogen, so as to prevent outside air from flowing into the transfer chamber TC. In an unloading process, after the film formation process completes, the load lock LL holds the substrates S until they approach room temperature so as to prevent sudden changes in temperature of the substrates S.

The transfer chamber TC transfers the substrates S between the film formation chambers PC1 to PC4 and the load lock LL in accordance with the film formation operation of the film formation chambers PC1 to PC4. Namely, in a first transfer operation, substrates S are transferred from the load lock LL to the first through third film formation chambers PC1 to PC3, and in a second transfer operation, the substrates S are transferred from the first through third film formation chambers PC1 to PC3 to the fourth film formation chamber PC4. In a third transfer operation, the substrate S is transferred from the fourth film formation chamber PC4 to the load lock LL. Except during the various transfer operations, shutter mechanisms provide shielding between the transfer chamber TC and the film formation chambers PC1 to PC4, and between the transfer chamber TC and the load lock LL.

As shown in FIG. 3, substrates S are loaded one at a time while respectively staggered by a time duration L0 into the first through third film formation chambers PC1 to PC3, and the silicon nitride film and silicon oxide film are formed on the substrates S at a film formation time L1. The time difference L0 is set to be approximately ⅓ of the film formation time L1. As a result, at the first through third film formation chambers PC1 to PC3, the film formation process for one substrate S completes at the passage of every time duration L0. The substrates S, after having undergone the film formation process at the first through third film formation chambers PC1 to PC3, are loaded one at a time into the fourth film formation chamber PC4, and onto the substrates S are formed the amorphous silicon film at time L2. This film formation time L2 is set to be shorter than the time difference L0 of the film formation processes of the first through third film formation chambers PC1 to PC3. In other words, since the film formation process completes at the fourth film formation chamber PC4 at time L2, which is ⅓ or less than time L1 of the film formation process at the first through third film formation chambers PC1 to PC3, three times the number of substrates S can be processed in comparison to the first through third film formation chambers PC1 to PC3. As a result, the substrates S to be processed in parallel at the first through third film formation chambers PC1 to PC3 can be processed in succession at the fourth film formation chamber PC4.

In this sort of manufacturing apparatus, equivalent film formation is possible simply by increasing, compared to the case where the three films are formed in the same film formation chamber, the total manufacturing time for the formation of the silicon nitride film, silicon oxide film, and amorphous silicon film by the time required for transferring the substrates S. Since only the amorphous silicon film is formed at this time at the fourth film formation chamber PC4, any contamination of the amorphous silicon film with impurities can be prevented.

Figure 1:
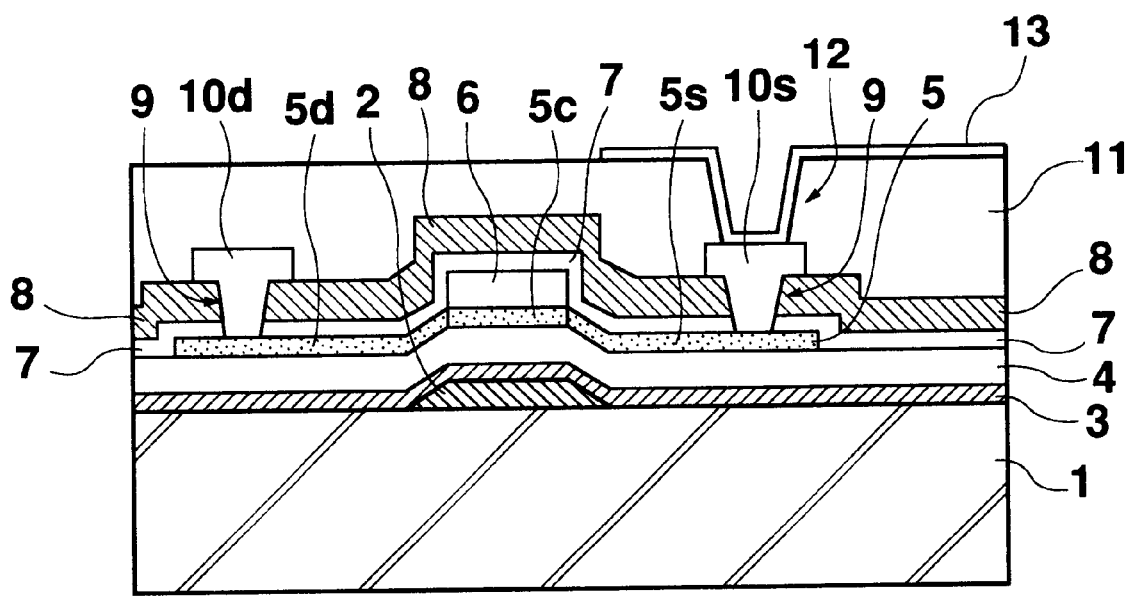
FIG. 1 is a cross-sectional view showing a structure of a conventional thin-film transistor.

FIGS. 4A to 4F are cross-sectional views of individual processes illustrating the manufacturing method of thin-film transistors of the present invention. These drawings show the same bottom-gate type as FIG. 1.

Figure 4A:
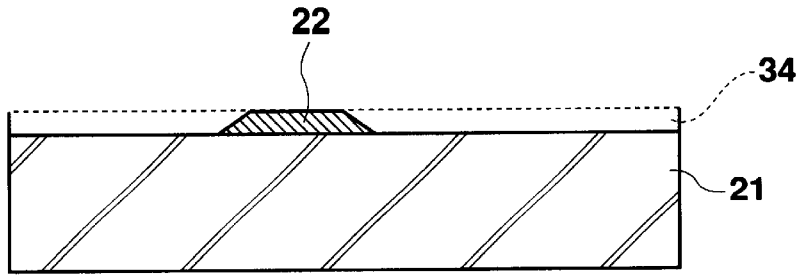
FIGS. 4A, 4B, 4C, 4D, 4E, and 4F are cross-sectional views showing respective processes of a thin-film transistor manufacturing method of the present invention.

(a) First Process (FIG. 4A)

On an insulating transparent substrate 21 is sputtered a high melting point metal (refractory metal), such as chromium or molybdenum, to form a refractory metal film 34. The refractory metal film 34 is patterned in a predetermined shape to form a gate electrode 22. This patterning process uses taper etching to form a tapered shape so that both sides of the gate electrode 22 widen toward the transparent substrate 21.

Figure 4B:
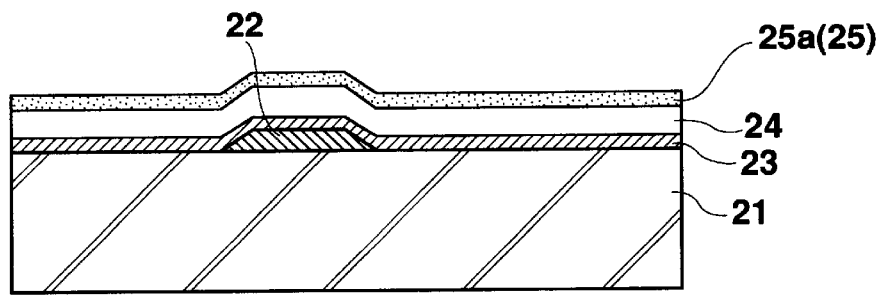

(b) Second Process (FIG. 4B)

On the transparent substrate 21 is applied the silicon nitride film through plasma CVD to form a silicon nitride film 23, which prevents the precipitation of impurity ions from the transparent substrate 21. Next, in the same film formation chamber using the same plasma CVD method, a silicon oxide film is applied to form a silicon oxide film 24, which forms the gate insulating films together with the silicon nitride film 23. The formation of the silicon nitride film 23 and silicon oxide film 24 is performed using the respective first through third film formation chambers PC1 to PC3 shown in FIG. 2. Silicon is then applied on the silicon oxide film 24 through the same plasma CVD method so as to form an amorphous silicon film 25a. The formation of the amorphous silicon film 25a is performed using the fourth film formation chamber PC4 of the apparatus shown in FIG. 2. With the time required for the formation of silicon nitride film 23 and silicon oxide film 24 at, for example, approximately 270 seconds and the time required for the formation of the amorphous silicon film 25a at, for example, approximately 90 seconds, the ratio of the processing times becomes approximately 3:1. Therefore, as shown in FIG. 2, a plurality of transparent substrates 21 are processed in succession at high efficiency. Forming the amorphous silicon film 25a in the dedicated film formation chamber reduces the amount of impurities contaminating the amorphous silicon film 25a. On the basis of actual measured values, it was confirmed that the oxygen concentration is reduced from approximately $10^{20}/cm^3$ to $10^{19}/cm^3$ when comparing the case in which the silicon oxide film 24 and amorphous silicon film 25a are formed in the same film formation chamber with the case in which the amorphous silicon film 25a is formed in a separate film formation chamber.

Figure 4C:
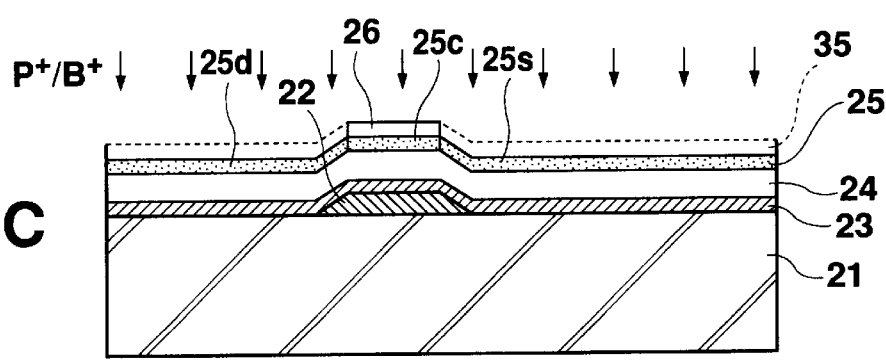

(c) Third Process (FIG. 4C)

The amorphous silicon film 25a that was formed on the silicon oxide film 24 is heated to discharge the hydrogen contained within the film to outside the film. In this heating process, the hydrogen concentration in the amorphous silicon film 25a is reduced to 1 atoms % or less. After the hydrogen is discharged, an excimer laser is aimed at the silicon film 25a to heat the amorphous silicon until it melts, then the silicon crystallizes to form a polycrystalline silicon film 25. Next, through the plasma CVD method, silicon oxide is formed on the polycrystalline silicon film 25 to form a silicon oxide film 35. The silicon oxide film 35 is then patterned to match the shape of the gate electrode 22, and a stopper 26 is formed to overlap the gate electrode 22. In the formation of the stopper 26, mask deviation can be eliminated by forming a resist layer to cover the silicon oxide film 35 and exposing the resist layer from the underside of the transparent substrate 21 with the gate electrode 22 as a mask. With the stopper 26 as the mask, the polycrystalline silicon film 25 is then doped with either P-type or N-type ions corresponding to the type of transistor to be formed. Namely, the polycrystalline silicon film 25 not covered by the stopper 26 is doped with P-type ions, such as of boron, when forming a P-channel transistor, or N-type ions, such as of phosphorous, when forming an N-channel transistor. This doping process forms regions exhibiting P-type or N-type conductivity in the polycrystalline silicon film 25 except in the part covered by the stopper 26. These regions on both sides of the stopper 26 become a source region 25s and a drain region 25d.

Figure 4D:
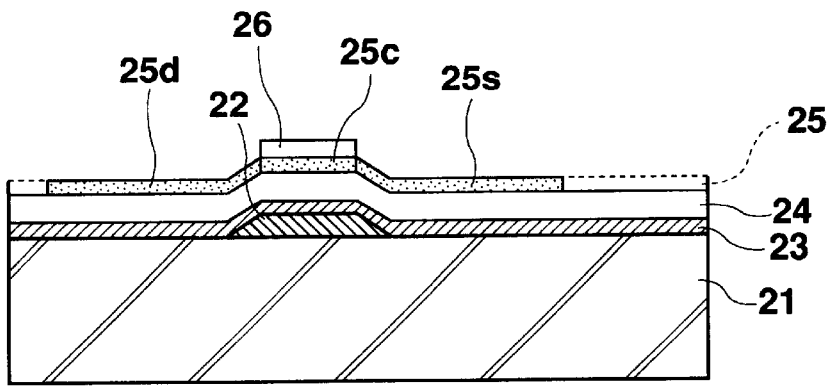

(d) Fourth Process (FIG. 4D)

The excimer laser is aimed at the polycrystalline silicon film 25, on which the source region 25s and drain region 25d have been formed, to heat the silicon without melting. This activates the impurity ions within the source region 25s and drain region 25d. The polycrystalline silicon film 25 is then patterned into a island shape while leaving a predetermined width on both sides of the stopper 26 (gate electrode 22) so as to separate the individual transistor.

Figure 4E:
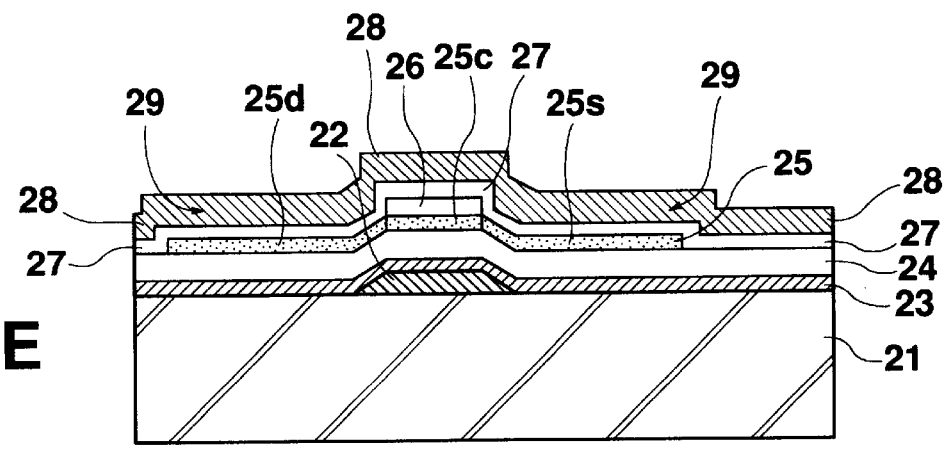

(e) Fifth Process (FIG. 4E)

Silicon oxide and silicon nitride are formed in succession through plasma CVD on the polycrystalline silicon film 25. This forms two interlayer insulating films of a silicon oxide film 27 and a silicon nitride film 28. The silicon oxide film 27 and silicon nitride film 28, after being formed, are heated in a nitrogen atmosphere so that the hydrogen ions contained in the silicon nitride film 28 are introduced to the polycrystalline silicon film 25. As a result, the crystal defects within the polycrystalline silicon film 25 are filled by the hydrogen ions.

Figure 4F:
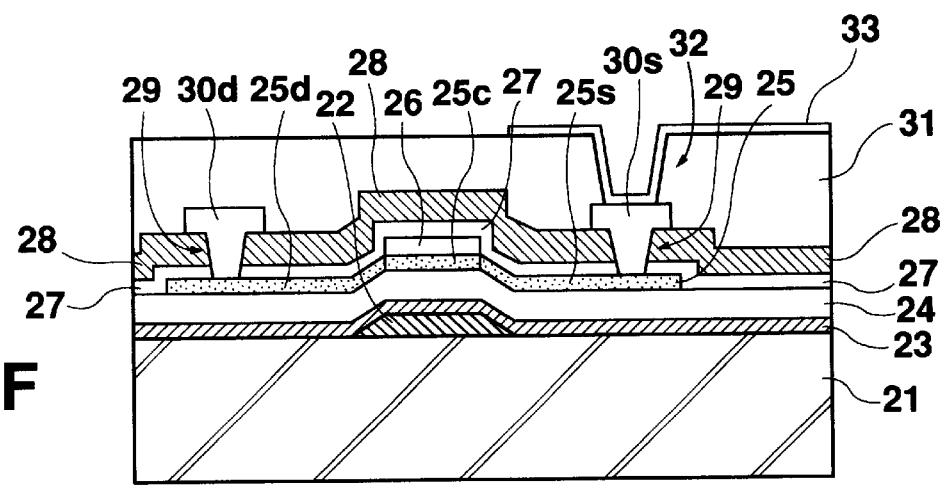

(f) Sixth Process (FIG. 4F)

Contact holes 29 are formed so as to pass through the silicon oxide film 27 and silicon nitride film 28 to correspond to the source region 25s and drain region 25d, and at the contact holes 29 are formed a source electrode 30s and a drain electrode 30d of a metal, such as aluminum. The source electrode 30s and drain electrode 30d are formed, for example, by patterning sputtered aluminum on the silicon nitride film 28 on which the contact holes 29 were formed. Next, an acrylic resin solution is applied and baked on the silicon nitride film 28, on which the source electrode 30s and drain electrode 30d were formed, to form an acrylic resin layer 31. The acrylic resin layer 31 planarizes the surface by filling in the unevenness caused by the stopper 26, source electrode 30s, and drain electrode 30d. Furthermore, a contact hole 32 is formed so as to pass through the acrylic resin layer 31 on the source electrode 30s, and at the contact hole 32 is formed a transparent electrode 33, such as of ITO, to connect to the source electrode 30s. The transparent electrode 33 is formed, for example, by patterning sputtered ITO on the acrylic resin layer 31, on which the contact hole 32 was formed.

The above-mentioned first through sixth processes form the bottom-gate thin-film transistor.

It should be noted that although four film formation chambers were used in this embodiment to form the gate insulating films and the semiconductor film at a 3:1 ratio, the number of film formation chambers is not limited to four. A comparable effect can be obtained even with three, or five or more film formation chambers disposed provided the film formation chambers are used in accordance with the ratio of the time required to form the gate insulating films to the time required to form the semiconductor film.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A thin-film transistor manufacturing method comprising:

a first process for forming a gate electrode on one principal plane of the substrate;

a second process for forming gate insulating films covering said gate electrode on said substrate;

a third process for forming the semiconductor film of an island shape on said gate insulating films so as to straddle said gate insulating films; and a fourth process for forming interlayer insulating films on said semiconductor film;

said second process processes in parallel a plurality of said substrates in a plurality of first film formation chambers at a predetermined time difference shorter than the time required for film formation; and said third process processes said substrates in succession in a single second film formation chamber at a time shorter than the film formation time in said second film formation chamber.

2. The thin-film transistor manufacturing method according to claim 1 wherein:

a plurality of said first film formation chambers are disposed in parallel in proportion to the ratio of the film formation time of said second process to the film formation time of said third process.

3. The thin-film transistor manufacturing method according to claim 1 wherein:

said second process forms the silicon nitride film and silicon oxide film in succession on said substrate.

4. A thin-film transistor manufacturing method using a semiconductor device manufacturing apparatus comprising:

a first film formation chamber for depositing in succession at least two types of insulating films onto a substrate;

a second film formation chamber for depositing a semiconductor film onto the substrate; and a transfer chamber for connecting said first film formation chamber to said second film formation chamber and for transferring the substrate from said first film formation chamber to said second film formation chamber, or from said second film formation chamber to said first film formation chamber; wherein, said second film formation chamber performs a film formation process in succession to a film formation process of said first film formation chambers to form an insulating films of the thin-film transistor on the substrate, then to form a semiconductor film of the thin-film transistor on the insulating films.

5. A thin-film transistor manufacturing method using a semiconductor device manufacturing apparatus comprising:

the first film formation chamber for forming a first material film on the substrate; and the second film formation chamber for forming, after said first material film, a second material film unlike said first material film;

a ratio of a number of said first film formation chambers to that of said second film formation chambers is proportional to a ratio of the time required for film formation in said first film formation chamber to the time required for film formation in said second film formation chamber so that said first film formation chambers and said second film formation chambers are disposed with their numbers in a predetermined ratio, wherein a first material film of said thin-film transistor is formed on the substrate at each of the first film formation chambers, and a second material film of said thin-film transistor is formed on said first material film.

* * * * *